United States Patent
Mei et al.

[11] Patent Number: 6,130,453
[45] Date of Patent: Oct. 10, 2000

[54] FLASH MEMORY STRUCTURE WITH FLOATING GATE IN VERTICAL TRENCH

[75] Inventors: Shaw-Ning Mei; Edward J. Vishnesky, both of Poughkeepsie, N.Y.

[73] Assignee: International Business Machines Corporation, Armonk, N.Y.

[21] Appl. No.: 09/225,055

[22] Filed: Jan. 4, 1999

[51] Int. Cl.[7] ................................................ H01L 29/788
[52] U.S. Cl. ........................................ 257/315; 257/316
[58] Field of Search ................................ 257/315–319, 257/330

[56] References Cited

U.S. PATENT DOCUMENTS

| | | | |
|---|---|---|---|
| 4,929,988 | 5/1990 | Yoshikawa | 257/316 |
| 5,386,132 | 1/1995 | Wong . | |
| 5,479,368 | 12/1995 | Keshtbod . | |
| 5,492,846 | 2/1996 | Hara . | |
| 5,495,441 | 2/1996 | Hong . | |
| 5,512,505 | 4/1996 | Yuan et al. . | |
| 5,617,351 | 4/1997 | Bertin et al. . | |
| 5,640,031 | 6/1997 | Keshtbod . | |
| 5,656,544 | 8/1997 | Bergendahl et al. . | |
| 5,680,345 | 10/1997 | Hsu et al. . | |

OTHER PUBLICATIONS

Yamauchi, Yoshimitsu; Tanaka, Kenichi; Shibayama, Hikou; Miyaka, Ryuichiro—A 5V–Only Virtual Ground Flash Cell With an Auxiliary Gate for High Density and High Speed Application—VLSI Research Laboratory, Sharp Corporation 1991 IEEE, pp. 11.7.1–11.7.4.

Ma, Y; Pang, C.S.; Pathak, J.; Tsao, S.C. and Chang, C.F.—A Novel High Density Contactless Flash Memory Array Using Split–Gate Source–Side–Injection Cell for 5V–Only Applications—1994 Symposium of VLSI Technology Digest of Technical Papers—VLSI Research Laboratory, Sharp Corporation, 1994 IEEE, pp. 49–50.

*Primary Examiner*—Tom Thomas
*Assistant Examiner*—Thien F Tran
*Attorney, Agent, or Firm*—DeLio & Peterson, LLC; Peter W. Peterson; Eugene I. Shkurko

[57] ABSTRACT

A flash memory cell comprises a substrate having a trench formed below the substrate surface, a vertical bit line or auxiliary gate deposited in the trench below the surface, a drain region formed in the substrate below the bit line, and a split floating gate deposited in the trench below the surface to a depth less than the vertical bit line. The floating gate includes a first vertical portion on one side of the bit line and a second vertical portion on another side of the bit line opposite the first vertical portion, with each portion of the gate being accessed by the bit line. The memory cell further includes a source region formed below the surface spaced apart from and adjacent each of the floating gate portions and a word line or control gate extending over the substrate, bit line and floating gate portions. The vertical bit line and split floating gate portions extend from the substrate surface to the bottom of the trench, and adjacent portions of the bit line and the floating gate portions extend above the substrate surface at substantially the same height.

12 Claims, 3 Drawing Sheets

FLASH MEMORY STRUCTURE WITH FLOATING GATE IN VERTICAL TRENCH

BACKGROUND OF THE INVENTION

1. Field of the Invention

This invention relates generally to flash memory cells for use in semiconductor electronic devices and, in particular, to a flash memory EEPROM structure with a split floating gate in a vertical trench.

2. Description of Related Art

There has been a trend in the computer industry to replace disk drives with nonvolatile semiconductor memory. Examples of such memory are electrically programmable and erasable memory devices (EEPROMs) which are generally referred to as flash memory structures. Various types of such memory structures have been disclosed in the prior art, examples of such being the devices disclosed in U.S. Pat. Nos. 5,680,345 and 5,521,505, the former of which discloses a floating gate and control gate in a trench below a silicon substrate surface and the latter of which discloses the floating gate and control gate formed above the silicon surface.

U.S. Pat. Nos. 5,617,351 and 5,656,544 disclose an EEPROM cell which utilizes a split gate, but no common bit line for the split gate. U.S. Pat. No. 5,495,441 discloses a split gate flash memory cell with the control gate in the substrate trench and the floating gate above the surface of the substrate and extending to the spaced source region. U.S. Pat. No. 5,386,132 discloses a split gate EEPROM with vertical floating gates in a trench, but with a control gate spaced apart also in the trench and extending beyond the depth of the floating gate to a buried source region.

In general, split gate flash memory cells have a number of advantages over conventional flash memory cells, such as low voltage power supply operation and over-erase immunity. However, due to their horizontal layout structure, prior art split gate flash memory cells generally have a much larger cell size as compared to conventional flash memory cells. More recent approaches to reduce cell size of split gate flash memory cells is to build a floating gate and bit line vertically above the substrate surface. This approach is disclosed in the publication "A Five V—only Virtual Ground Flash Cell with an Auxiliary Gate for High Density and High Speed Application" by Yamauchi et al. and in U.S. Pat. Nos. 5,479,368, 5,492,846, and 5,640,031. However these split gate configurations require a relatively large surface topography which is created by the upward vertical structure. This structure makes the manufacture of the flash memory cell relatively difficult and complex.

Bearing in mind the problems and deficiencies of the prior art, it is therefore an object of the present invention to provide an improved method of making a flash EEPROM memory cell with a split gate.

It is another object of the present invention to provide a flash memory structure having a floating gate and bit line which is less complex and more easily manufactured than the prior art.

A further object of the invention is to provide a flash memory structure with a floating gate and bit line which reduces the surface topography.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a flash memory cell comprising a substrate having a trench formed therein and below a surface thereof, a vertical bit line, also known as an auxiliary gate, deposited in the trench below the substrate surface and a floating gate deposited in the trench below the substrate surface. The floating gate comprises a first vertical portion on one side of the bit line and a second vertical portion on another side of the bit line opposite the first vertical portion, with each portion of the gate being accessed by the bit line.

Preferably, the memory cell further includes a drain region formed in the substrate below the bit line and a source region formed below the substrate surface spaced apart from and adjacent at least one, and more preferably each, of the floating gate portions. The memory cell may also include a word line, also known as a control gate, extending over the substrate, bit line and floating gate portions.

In the memory cell, the vertical bit line and split floating gate portions preferably extend from the substrate surface to the bottom of the trench, and extend above the substrate surface. More preferably, adjacent portions of the bit line and the floating gate portions extend above the substrate surface at substantially the same height.

In a related aspect, the present invention provides a flash memory cell comprising a substrate having a trench formed therein and below a surface thereof, a vertical bit line or auxiliary gate deposited in the trench below the substrate surface, a drain region formed in the substrate below the bit line, and a split floating gate deposited in the trench below the substrate surface to a depth less than the vertical bit line. The floating gate comprises a first vertical portion on one side of the bit line and a second vertical portion on another side of the bit line opposite the first vertical portion, with each portion of the gate being accessed by the bit line. The memory cell further comprises a source region formed below the substrate surface spaced apart from and adjacent at least one of the floating gate portions and a word line or control gate extending over the substrate, bit line and floating gate portions.

In the memory cell, the vertical bit line and split floating gate portions preferably extend from the substrate surface to the bottom of the trench, and adjacent portions of the bit line and the floating gate portions extend above the substrate surface at substantially the same height.

In another aspect, the present invention relates to a process for forming a flash memory cell in a substrate. The process comprises forming a first vertical trench in and below a surface of the substrate and depositing a floating gate in the first vertical trench below the substrate surface. A second vertical trench is then formed in the floating gate to split the floating gate into two portions. A vertical bit line (auxiliary gate) is deposited in the second vertical trench below the substrate surface, wherein the bit line being capable of accessing each of the split floating gate portions.

The process may further include the steps of forming a drain region in the substrate below the second vertical trench and forming a source region below the substrate surface spaced apart from and adjacent at least one, and preferably each, of the floating gate portions. The process may also include forming a word line (control gate) over the substrate, bit line and floating gate portions.

Preferably, the floating gate extends from the substrate surface to the bottom of the trench, the vertical bit line extends from the substrate surface to the bottom of the trench and the second vertical trench is extended below the floating gate into the substrate.

In a related aspect, the present invention provides a process for forming a flash memory cell in a substrate comprising the steps of forming a first vertical trench in and below a surface of the substrate; depositing a floating gate in the first vertical trench extending from the substrate surface to the bottom of the first vertical trench; forming a second vertical trench in the floating gate to split the floating gate into two portions; forming a drain region in the substrate below the second vertical trench; depositing a vertical bit line (auxiliary gate) in the second vertical trench extending from the substrate surface to the bottom of the second vertical trench, the bit line being capable of accessing each of the split floating gate portions; forming a source region below the substrate surface spaced apart from and adjacent at least one of the floating gate portions; and forming a word line (control gate) over the substrate, bit line, source and floating gate portions. The process may also include the step of finishing the bit line and split floating gate such that adjacent portions of the bit line and the floating gate portions extend above the substrate surface at substantially the same height.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
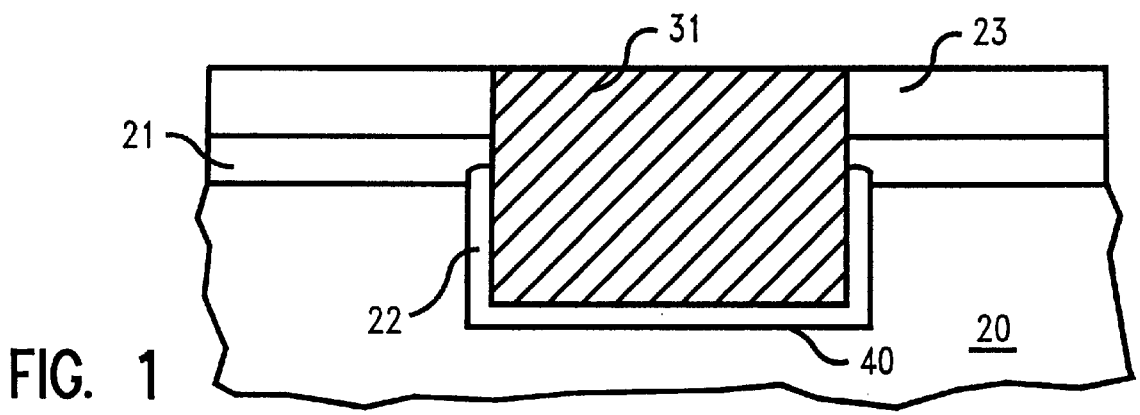
FIG. 1 is a vertical sectional view of a first stage in the process of forming the flash memory structure of the present invention, after a vertical floating gate is formed.

In describing the preferred embodiment of the present invention, reference will be made herein to FIGS. 1–9 of the drawings in which like numerals refer to like features of the invention. Features of the invention are not necessarily shown to scale in the drawings.

In contrast to the prior art approaches which build a flash memory structure with a split floating gate and bit line above the semiconductor substrate, it has been found that an improved structure and a process may be provided by forming a split floating gate and common bit line in a vertical trench below the surface of the semiconductor substrate. The preferred process for producing the flash memory structure of the present invention is depicted in FIGS. 1–7.

Initially, referring to FIG. 1, the single crystal silicon substrate 20 of a wafer has deposited thereon a thick gate silicon dioxide layer 21. Preferably, the thickness of layer 21 is from about 200 to 300 angstroms. Thereafter, a second dielectric layer 23 of silicon nitride is deposited over the silicon oxide dielectric layer 21. The silicon nitride layer is then masked with a floating gate (FG) mask as shown in the top plan view of FIG. 7. Reactive ion etching is utilized to form a trench 40 extending below the surface of substrate 20. After the mask is stripped, a thin gate silicon dioxide layer 22 is deposited to line the inner surfaces of trench 40. Thereafter, a polycrystalline silicon 31 is deposited to fill trench 40, and chemical mechanical polishing is utilized to make coplanar the upper surfaces of polysilicon filled 31 and nitride layer 23.

Figure 2:
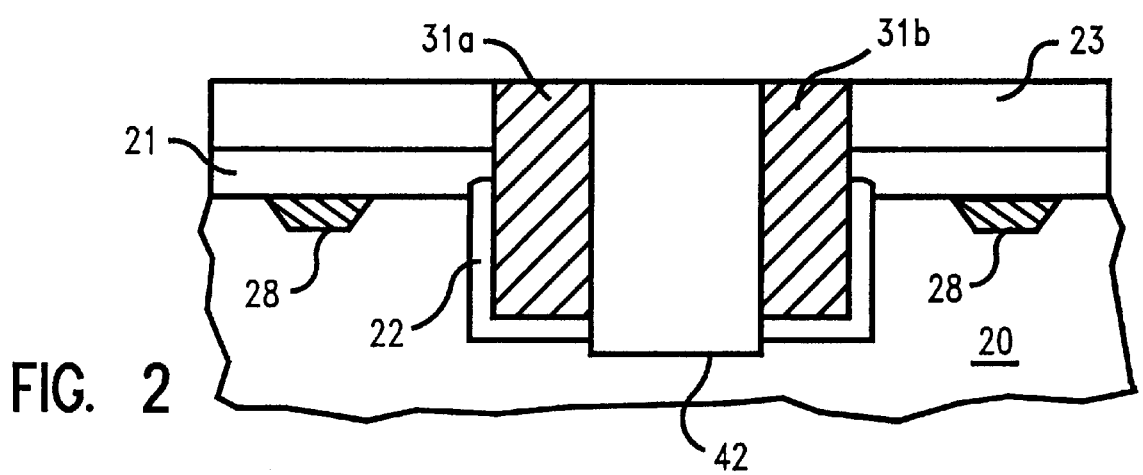
FIG. 2 is a vertical sectional view of a process stage subsequent to FIG. 1 in which the floating gate is split.
Figure 7:
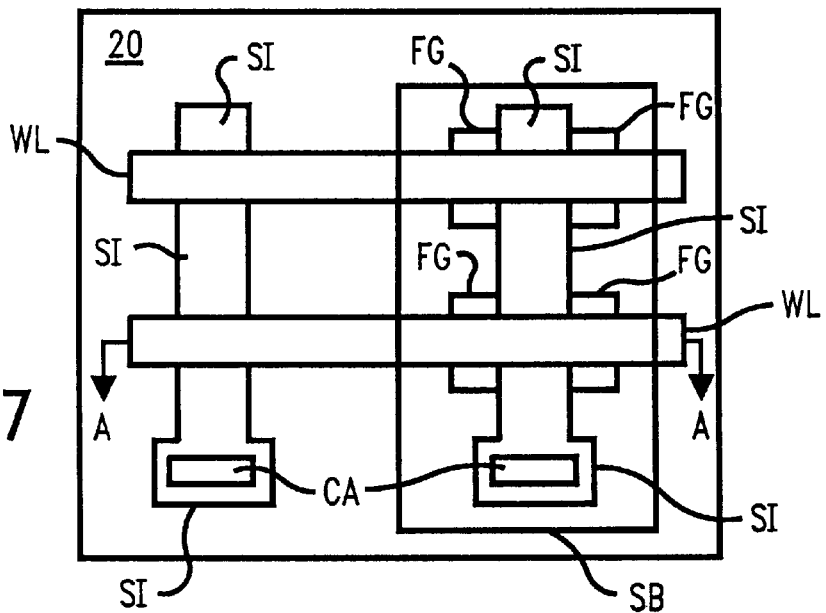
FIG. 7 is a top plan view of the various masks employed to form the structural elements shown in FIGS. 1–6 along line A—A.

Turning to FIG. 2, a source implant (SI) mask as shown in FIG. 7 is deposited over nitride layer 23 to permit implanting of arsenic to form the source regions 28 spaced apart and on either side of the previously formed gate. A mask is then applied over the surface of the SI mask which exposes a portion of the surface of the polysilicon gate fill 31. Reactive ion etching is the used to create trench 42 which splits the floating gate into split floating gate portions 31a, 31b. The bottom of trench 42 may extend below the bottom of split floating gate portions 31a, 31b.

Figure 3:
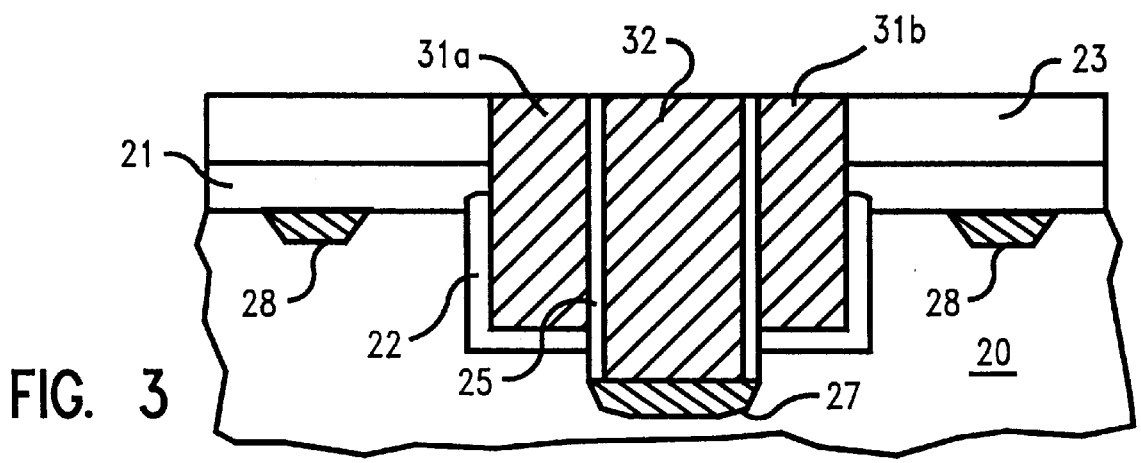
FIG. 3 is a vertical sectional view of a process stage subsequent to FIG. 2 in which a vertical bit line is formed between the split floating gate.

As shown further in FIG. 3, the masks are stripped and there is formed a thin silicon nitride film on the walls of trench 42, which film is then oxidized and reactive ion etched to form the thin nitride spacer 25. Subsequently, an n-type dopant such as arsenic or phosphorous is implanted at the bottom of trench 42 to form drain region 27. Trench 42 is then filled with polysilicon to form a bit line 32, also known as the auxiliary gate. As shown, the lower portion of bit line 32 extends below the lowermost portions of split floating gate portions 31a, 31b. The structure is then again subject to chemical mechanical polishing to make the surface of nitride layer 23 and the bit line 32 and split floating gate portions 31a, 31b regions coplanar.

Figure 4:
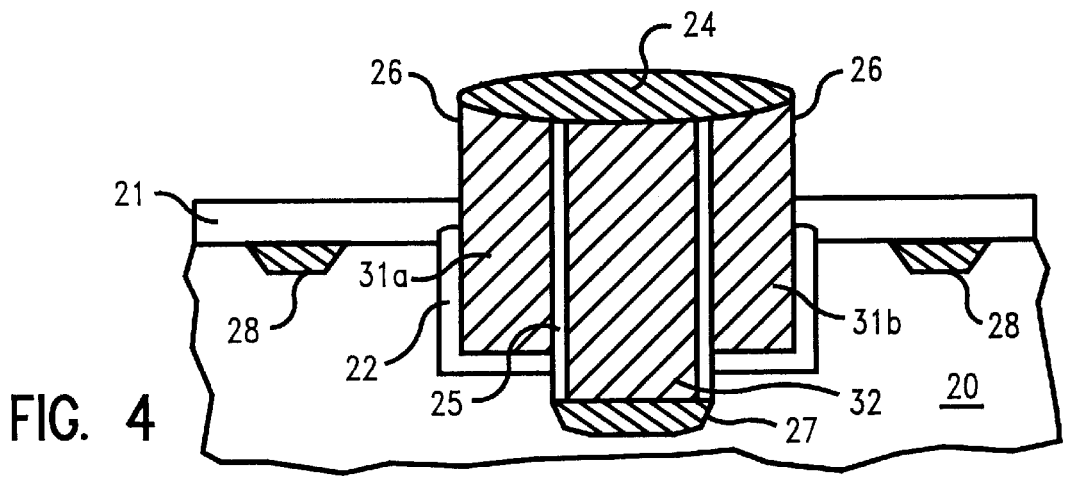
FIG. 4 is a vertical sectional view of a process stage subsequent to FIG. 3 in which an oxide is deposited over the vertical bit line and split floating gate.
Figure 5:
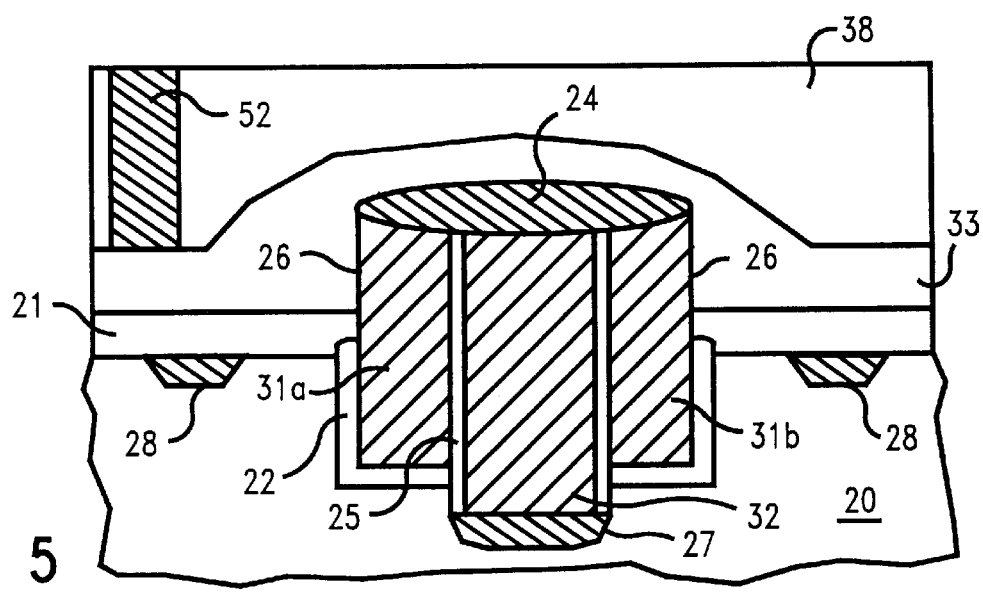
FIG. 5 is a vertical sectional view of a process stage subsequent to FIG. 4 in which a word line and insulator are deposited over the oxide, vertical bit line and split floating gate.

A cap silicon oxide layer 24 is then grown over the bit line and split floating gate region, as shown in FIG. 4, and nitride layer 23 is stripped using a hot phosphorous stripping agent. A tunneling silicon dioxide layer 26 is then applied to the exposed vertical side surfaces of a floating gate portions 31a, 31b, above oxide layer 21. The uppermost portion of bit line 32 and split floating gate portions 31a, 31b extend above the surface of substrate 20 at substantially the same height. Thereafter, as shown in FIG. 5, a polysilicon layer 33 is applied which, after masking with the word line (WL) mask as shown in FIG. 7 and reactive ion etching, forms the word line, also known as the control gate, for the flash memory structure. The WL mask is then stripped and the gate side walls are oxidized and a spacer nitride is then deposited and reactive ion etched. Optionally, there may be formed a layer of titanium salicide over the polycrystalline word line 33. Thereafter, an insulator 38 such as polysilicate glass (PSG) is deposited over the word line. A contact (CA) mask as shown in FIG. 7 is then applied and reactive ion etched to form vertical openings in which metal 52 is deposited to form a via. After chemical mechanical polishing the surface of insulator 38, a metal mask is then applied and reactive ion etched to leave metal layers 51 (FIG. 6) in contact with the metal via 52 which contacts the control gate.

Figure 8:
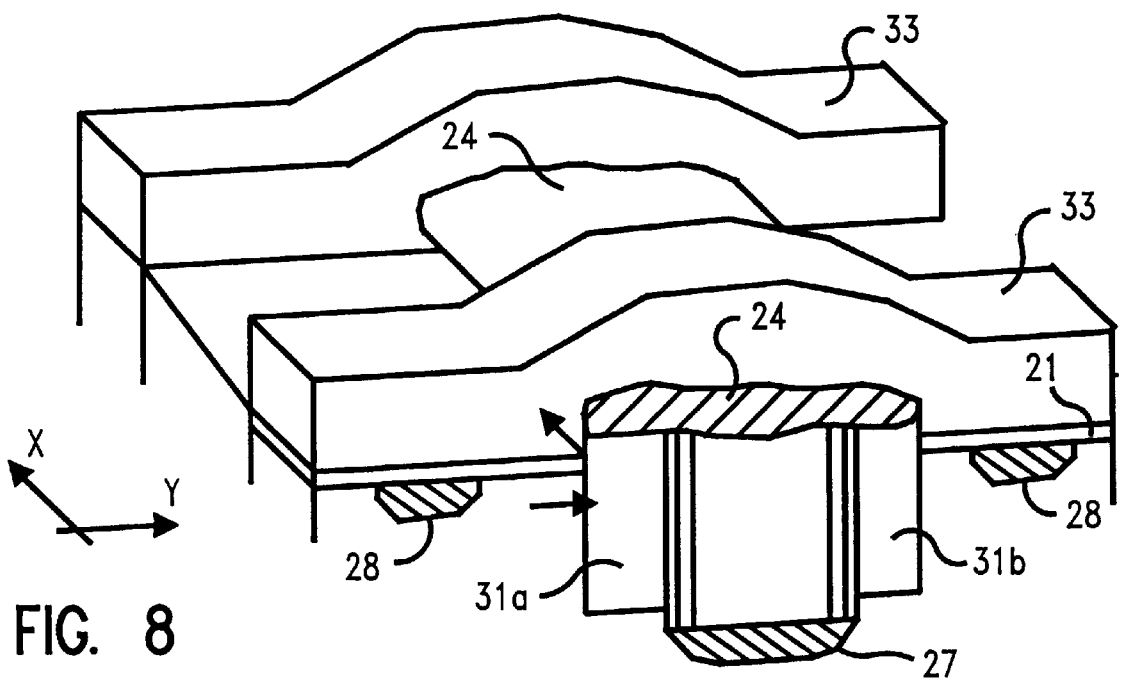
FIG. 8 is a perspective view of the flash memory structure formed by the process shown in FIGS. 1–6.

The finished structure is shown in perspective view (with the insulator layer removed) in FIG. 8 wherein the source 28, floating gate 31a, 31b, bit line 32, drain 27 and oxide cap 24 extend along the X-direction of the structure while the word lines 33 extend thereover in the Y-direction in discreet sections.

Figure 9:
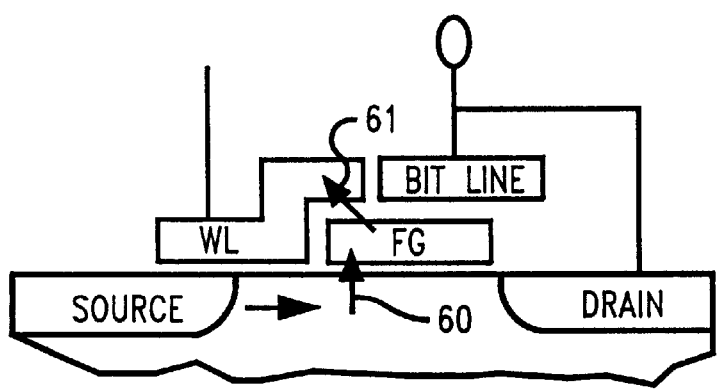
FIG. 9 is a schematic of the flash memory structure of the present invention.

A schematic of the flash memory structure of the present invention is shown in FIG. 9. To program the cell, a positive voltage of for example 8–10 volts is applied to the drain and bit line. This results in the ejection of hot electrons into the floating gate as indicated by arrow 60. At the same time the source is connected to ground and the word line (WL) is connected to a significantly lower voltage than the bit line, for example, approximately 1 volt.

To read the cell, the source is connected to a ground potential, the word line is connected to approximately 1 volt potential and the bit line and drain are connected to approximately 1.5 volt potential.

Figure 6:
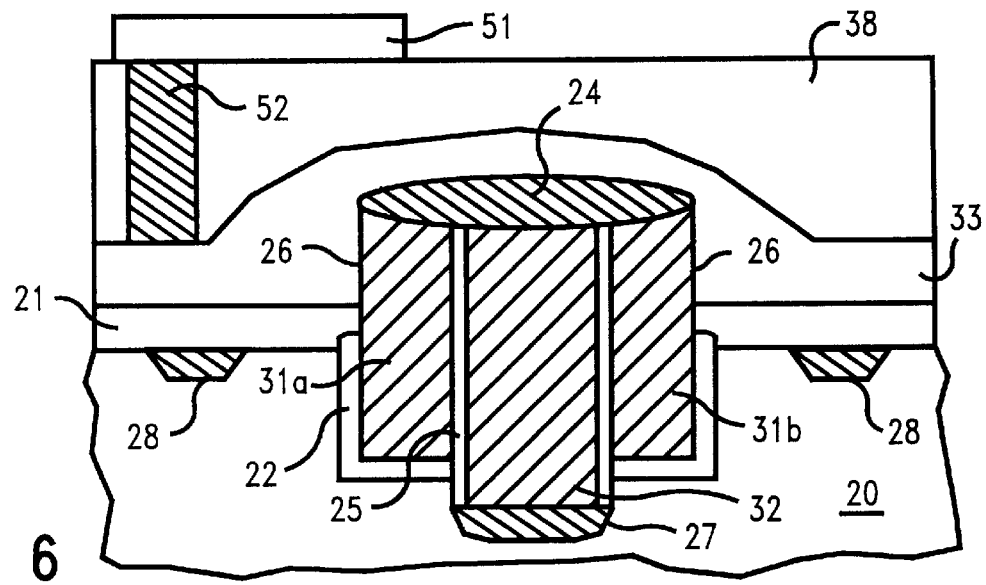
FIG. 6 is a vertical sectional view of a process stage subsequent to FIG. 5 in which metal vias are formed in the flash memory structure.

Erasing of the cell is done by applying positive voltage to the word line, e.g., 6 volts, to induce Fowler-Nordheim tunneling of electrons from the polysilicon floating gate (FG) to the polysilicon word line (WL) as shown by arrow 61 through the thin tunneling oxide layer (26 FIGS. 4–6). Accordingly, the present invention provides a EEPROM flash memory cell which has excellent operational parameters while having a considerably simpler structure which may be produced by a less complex process than the prior art.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A flash memory cell comprising:
    a substrate having a trench formed therein and below a surface thereof;
    a vertical bit line deposited in said trench below the substrate surface;
    a floating gate in said trench comprising a first vertical portion on one side of said bit line and a second vertical portion on another side of said bit line opposite said first vertical portion, each vertical portion of said floating gate extending above the substrate surface and being accessed by said bit line; and
    a tunneling gate oxide on the floating gate vertical portions extending above the substrate, the tunneling gate oxide permitting electron flow from the floating gate vertical portions to a word line extending over and along the sides of the floating gate vertical portions extending above the substrate.

2. The memory cell of claim 1 further including a drain region formed in said substrate below said bit line.

3. The memory cell of claim 1 further including a source region formed below the substrate surface spaced apart from and adjacent at least one of said floating gate portions.

4. The memory cell of claim 1 further including a source region formed below the substrate surface spaced apart from and adjacent each of said floating gate portions.

5. The memory cell of claim 1 further including a word line extending over said substrate, bit line and floating gate portions, and along sides of the floating gate vertical portions.

6. The memory cell of claim 1 wherein the vertical bit line and split floating gate portions extend from the substrate surface to the bottom of the trench.

7. The memory cell of claim 5 wherein said bit line extends above the substrate surface.

8. The memory cell of claim 1 wherein adjacent portions of said bit line and said floating gate portions extend above the substrate surface at substantially the same height.

9. A flash memory cell comprising:
    a substrate having a trench formed therein and below a surface thereof;
    a vertical bit line deposited in said trench below the substrate surface;
    a drain region formed in said substrate below said bit line;
    a split floating gate deposited in said trench below the substrate surface to a depth less than said vertical bit line, said floating gate comprising a first vertical portion on one side of said bit line and a second vertical portion on another side of said bit line opposite said first vertical portion, each vertical portion of said split floating gate extending above the substrate surface and being accessed by said bit line;
    a source region formed below the substrate surface spaced apart from at the same level and adjacent at least one of the floating gate vertical portions; and
    a word line extending over said substrate, bit line and floating gate vertical portions, and along sides of the floating gate vertical portions extending above the substrate.

10. The memory cell of claim 9 wherein the vertical bit line and split floating gate portions extend from the substrate surface to the bottom of the trench, and wherein adjacent portions of said bit line and said floating gate portions extend above the substrate surface at substantially the same height.

11. A flash memory cell comprising:
    a substrate having a trench formed therein and below a surface thereof;
    a vertical bit line deposited in said trench below the substrate surface, the bit line extending from a bottom of the trench to above the substrate surface;
    a drain region formed in said substrate below said bit line;
    a split floating gate deposited in said trench below the substrate surface to a depth less than said vertical bit line, said floating gate comprising a first vertical portion on one side of said bit line and a second vertical portion on another side of said bit line opposite said first vertical portion, each vertical portion of said split floating gate extending from a bottom of the trench to above the substrate surface and being accessed by said bit line;
    a tunneling gate oxide on sides of the floating gate vertical portions extending above the substrate;
    a source region formed below the substrate surface spaced apart from at the same level and adjacent at least one of the floating gate vertical portions; and
    a word line extending over said substrate, bit line and floating gate vertical portions, and along sides of tunneling gate oxide and floating gate vertical portions extending above the substrate, wherein electrons may flow from the floating gate vertical portions to the word line through tunneling gate oxide into the sides of the floating gate vertical portions extending above the substrate.

12. The memory cell of claim 11 wherein adjacent portions of said bit line and said floating gate portions extend above the substrate surface at substantially the same height.

* * * * *